United States Patent [19]
Tu et al.

[11] Patent Number: 5,882,953
[45] Date of Patent: Mar. 16, 1999

[54] DOPANT ACTIVATION OF HEAVILY-DOPED SEMICONDUCTOR BY HIGH CURRENT DENSITIES

[75] Inventors: King-Ning Tu; Jia-Sheng Huang, both of Los Angeles, Calif.

[73] Assignee: The Regents of the University of California, Oakland, Calif.

[21] Appl. No.: 679,136

[22] Filed: Jul. 12, 1996

[51] Int. Cl.⁶ .......................... H01L 21/44; H01L 21/425
[52] U.S. Cl. .......................... 438/101; 438/466; 438/510; 438/530
[58] Field of Search .................... 438/100, 101, 438/466, 467, 469, 510, 530, 533, 330, 332

[56] References Cited

U.S. PATENT DOCUMENTS

| | | | |
|---|---|---|---|
| 4,590,589 | 5/1986 | Gerzberg | 257/52 |
| 4,662,063 | 5/1987 | Collins et al. | 438/468 |
| 4,845,045 | 7/1989 | Shacham et al. | 438/529 |
| 5,095,362 | 3/1992 | Roesner | 257/330 |

FOREIGN PATENT DOCUMENTS

| | | | |
|---|---|---|---|
| 57-143857 | 9/1982 | Japan | 438/330 |
| 4-323818 | 11/1992 | Japan | 438/330 |
| 5-259174 | 10/1993 | Japan . | |

OTHER PUBLICATIONS

Wolf et al; "Silicon Processing For the VLSI Era"; vol 1, pp. 303–308, 1986.

Primary Examiner—Michael Trinh
Attorney, Agent, or Firm—Daniel L. Dawes

[57] ABSTRACT

Dopant activation in heavily boron doped $p^+$—Si is achieved by applying electric current of high density. The $p^+$—Si was implanted by a 40 KeV $BF^{2+}$ at an ion intensity $5 \cdot 10^{15}$ ions per $cm^2$ and annealed at 900° C. for 30 minutes to obtain a partial boron activation according to conventional processing steps. To obtain additional activation and higher conductivity, current was gradually applied according to the invention to a current density of approximately $5 \times 10^6$ A/cm² was realized. The resistance of the $p^+$—Si gradually increases and then decreases with a precipitous drop at a threshold current. The resistance was reduced by factor of 5 to 18 times and was irreversible if an activation current threshold was reached or exceeded. The high-current-density-dopant activation occurs at room temperature.

19 Claims, 4 Drawing Sheets

DOPANT ACTIVATION OF HEAVILY-DOPED SEMICONDUCTOR BY HIGH CURRENT DENSITIES

BACKGROUND OF THE INVENTION

1. Field of the Invention

The invention relates to the field of semiconductor processing and in particular to activation of ion implanted dopants.

2. Description of the Prior Art

Ion implantation is widely use to dope silicon for making shallow junction devices. The host lattice damage caused by ion implantation must be repaired by annealing in order to activate the dopant and to recover carrier mobility. Post implantation annealing, which is typically undertaken at 800°–1000° C. for 30 minutes, or rapid thermal annealing, at 1100° C. for one second, is typically performed for lattice damage repair subsequent to dopant ion implantation. However, in heavily-doped silicon, such as silicon having $10^{20}$ ions per $cm^3$ or more, these annealing procedures are incapable of achieving complete activation of the dopants. This failure of complete activation has been an unsolvable and perplexing problem for researchers in this field beginning from the 1960s to continuing to the present. While raising the temperature to provide higher temperature annealing is capable of also realizing better activation of dopants, annealing at these higher temperatures increases the thermal budget and broadens the junctions which are formed, which in the case of small devices results in an unacceptable broadening.

Moreover, as device processing rules decrease below the length of a wavelength used in the photolithographic patterning, it becomes necessary to maintain the shallow junction depths in proportion to the reduction in the lateral dimensions in order to maintain operability of the device. Moreover, as the device junctions and channels become smaller, signal strength decreases with decreasing current densities so that if an attempt is made to keep signal strengths at levels normally required within integrated circuits, current densities within the doped channels dramatically increase requiring increased conductivities to avoid overheating and to meet the performance requirements.

Therefore, what is needed is some means whereby conductivity of semiconductor material may be substantially increased without the use of high temperature annealing or other processes which would tend to broaden junctions or be subject to other defects of the prior art.

BRIEF SUMMARY OF THE INVENTION

The invention is a method of activating dopants in semiconductor material comprising the steps of supersaturating the semiconductor material with a dopant, and applying a high density current to the supersaturated semiconductor material above a predetermined activation threshold. As a result, the supersaturated dopants in the semiconductor material are activated.

In the illustrated embodiment the step of supersaturating the semiconductor material with the dopant comprises the step of ion implanting the dopant above a solid solubility limit for the semiconductor material.

The method further comprises the step of partially activating the dopants in the supersaturated semiconductor material prior to applying the high density current. The step of partially activating the dopants comprises the step of annealing the supersaturated semiconductor material to obtain partial thermal activation of the dopants.

In one embodiment the step of applying the high density current at or above an activation threshold comprises the step applying in a current of approximately $5 \cdot 10^6$ $A/cm^2$ or more generally with a current density of at least $5 \cdot 10^6$ $A/cm^2$ to obtain an irreversible reduction in resistivity of the doped semiconductor. In the preferred embodiment the high density current is applied at room temperature.

In the actual manufacture of a device or channel in a semiconductor substrate, the step of supersaturating the semiconductor with a dopant comprises the step of selectively defining a supersaturated doped channel within the semiconductor material. The dopant may be p type or n type. The method is particularly useful for manufacturing doped shallow channels of less than 1 micron depth. In the illustrated embodiment super saturated doped crystalline silicon is used but need not be so limited in general.

The invention is also defined as a method for activating dopants in silicon comprising the steps of ion implanting a dopant into the silicon to supersaturate the silicon with the dopant, annealing the doped silicon, and applying a high density current through the annealed doped silicon to irreversibly activate the supersaturated dopant in the silicon. A boron dopant is implanted in the silicon in excess of $10^{15}$ $ion/cm^2$ at 40 keV. The doped silicon is annealed at 900° C. for at least 30 minutes to achieve partial activation of the dopant. A current is applied at room temperature to the annealed doped silicon in excess of $5 \cdot 10^6$ $A/cm^2$.

The invention is also defined as a composition of matter comprising a crystalline semiconductor material supersaturated with a dopant in which the dopant has been activated by passage of a high density current through the semiconductor above an activation threshold current density.

The invention and its various embodiments may now be better visualized by turning to the following drawings wherein like comments are referenced by like numerals.

BRIEF DESCRIPTION OF DRAWINGS

FIG. 1b is a top plan view of the channel device of FIG. 1a.

The invention and its various embodiments may now be better understood by turning to the following detailed description.

DETAILED DESCRIPTION OF PREFERRED EMBODIMENT

In the illustrated embodiment described below dopant activation in heavily boron doped $p^+$—Si was created by applying electric current of high density. The p+—Si was implanted by a 40 KeV $BF_2^+$ at an ion intensity $5 \cdot 10^{15}$ ions per $cm^2$ and annealed at 900° C. for 30 minutes to obtain a partial boron activation according to conventional processing steps. Other intensities and energies may be used, and the present illustrated embodiment is set forth only as an example. To obtain additional activation and higher conductivity, current was gradually applied according to the invention to a current density of approximately $5 \times 10^6$ $A/cm^2$ was realized. The resistance of the p+—Si gradually increases and then decreases with a precipitous drop at a threshold current. The resistance was reduced by factor of 5 to 18 times and was irreversible if an activation current threshold was reached or exceeded. The high-current-density-dopant activation occurs at room temperature.

Figure 1A:
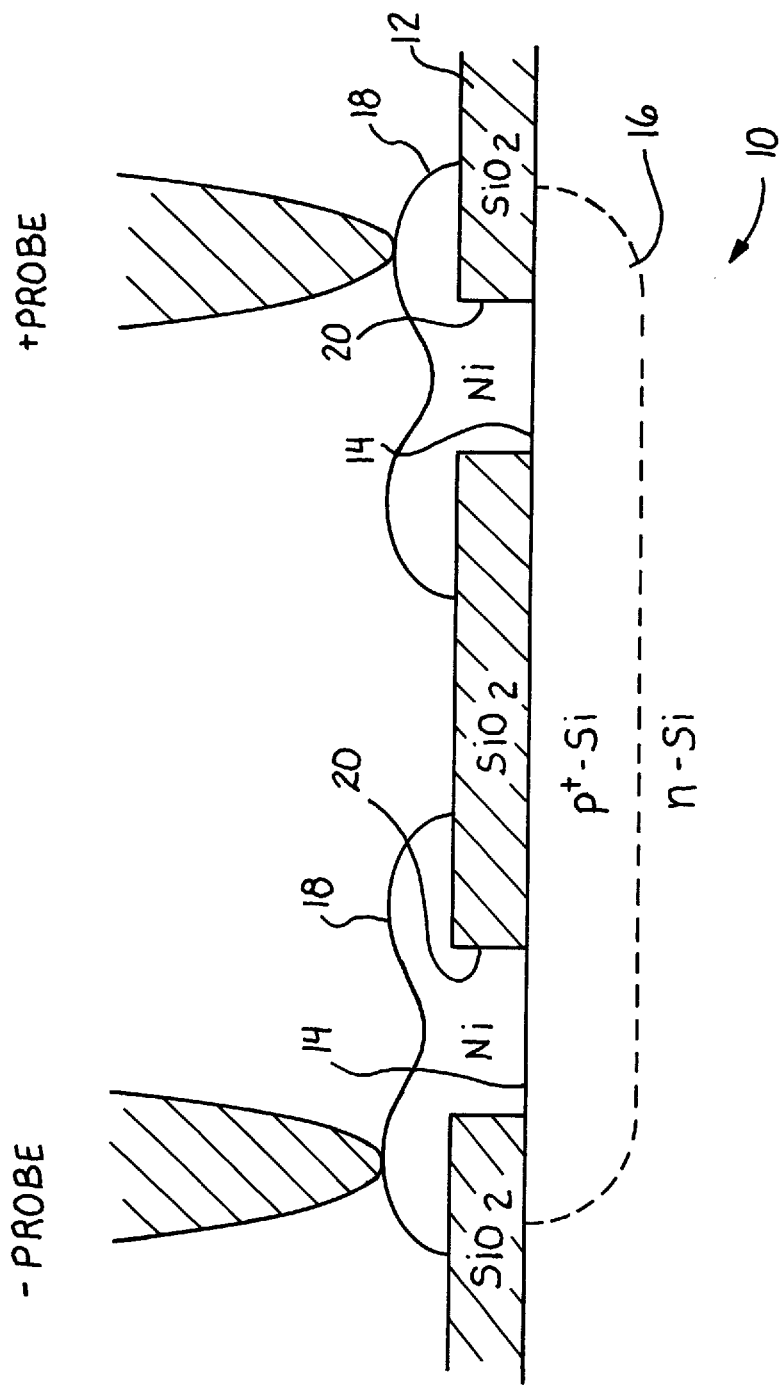
FIG. 1a is a side cross-sectional view of a semiconductor channel in which dopants are activated according to the invention.
Figure 1B:
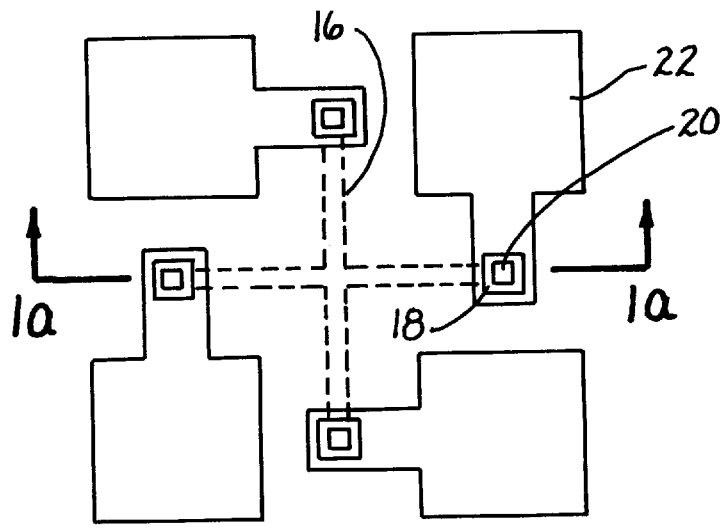

FIG. 1a is a side cross-sectional view of a (100) n-type, 3–5 ohm cm silicon substrate 10. Substrate 10 was oxidized to form the structure of FIG. 1, namely substrate 10 with a 300 nm silicon oxide layer 12 disposed thereon. Conventional photolithography and buffered hydrofluoric etching steps were employed to define channels 16 through oxide 12. As shown in FIG. 1b windows 14 were in the form of an orthogonal cross, but was used only for demonstration purposes. The invention may be employed in any type of semiconductor channel consistent with these teachings and is not limited to what is depicted in the FIGS. 1a and b or even to what is similar thereto.

A screen oxide (not shown) was grown to about 20 nm for filtering and capping the implanted ions. Substrate 10 was then implanted with a dosage $5 \cdot 10^{15}$ ions per $cm^2$ of $BF_2^+$ with a penetration energy of 40–50 keV to define doped channels 16. The projected range into substrate 10, namely the depth of channel 16 was about 0.15 microns. Post-implantation annealing at 900° C. for 30 minutes in a nitrogen environment was performed to activate the boron dopants within channel 16 according to conventional methodology. The sheet resistance of the heavily doped or supersaturated boron doped channel 16 at this point in the process was approximately 85.7 ohms per square centimeter.

In order to achieve any further activation beyond that achievable in this annealing step, contacts 18 were formed. A 300 nm low temperature oxide was grown on p-doped channel 16. A series of square contacts windows 20 were then defined in the oxide layer covering channels 16 using conventional photolithography and buffered HF etching and in the illustrated embodiments described below ranges in size from 10×10, 8×8, 6×6, 4×4, 2×2 and 1×1 microns. Ni, Ti or Al contacts 18 were then disposed with a thickness of 260 nm into window 20 to make electrical contacts to p+—Si.

FIG. 1(b) is a top plan view of the structure shown in FIG. 1(a). Metal bond pads 22 were defined by photolithography with a lift off process in acetone according to conventional technology. Channel 16, made in the shape of an X, therefore allows conductivity measurements to be made in orthogonal directions within substrate 10. Structures of the type shown in FIGS. 1(a) and (b) were prepared having p+—Si channels 16 with different lengths ranging 50, 70, 95, 97.5, 100, 140 and 175 microns long and with widths of 1, 2, 4, 6, 8 and 10 microns. Channel width was combined with contact size and different ohmic contact systems, such as Ni/p+—Si, Ti/p+—Si, Ni/silicide/p+—Si and Al/p+—Si, in order to demonstrate that the resistivity discussed below is independent of contact composition. The resistance changes at the p+—Si channel 16 in the samples described above together with contacts at different applied currents ranging from 1 to 80 mA, were then measured using a Keithley current source and voltage meter. Resistance changes at different temperatures, such as 25°, 100° and 200° C. were also measured as discussed below.

Figure 2A:
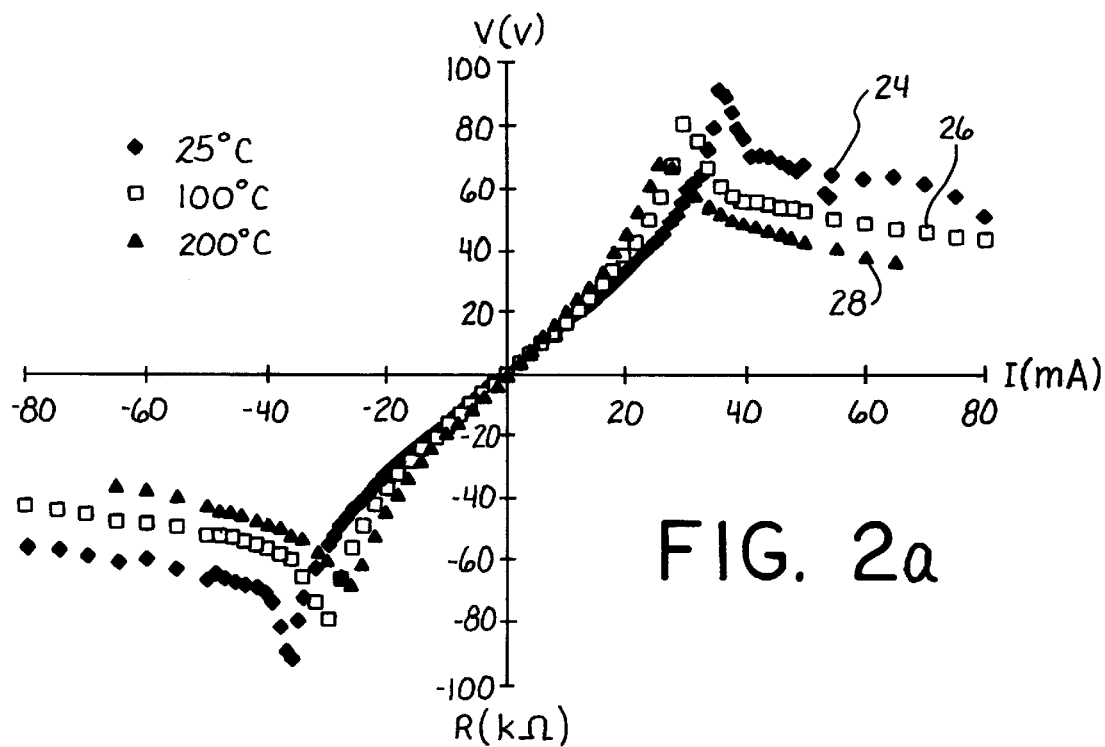
FIG. 2a is a graph of the voltage and current through the channel devised in FIGS. 1a and b according to the invention at three different temperatures.
Figure 2B:
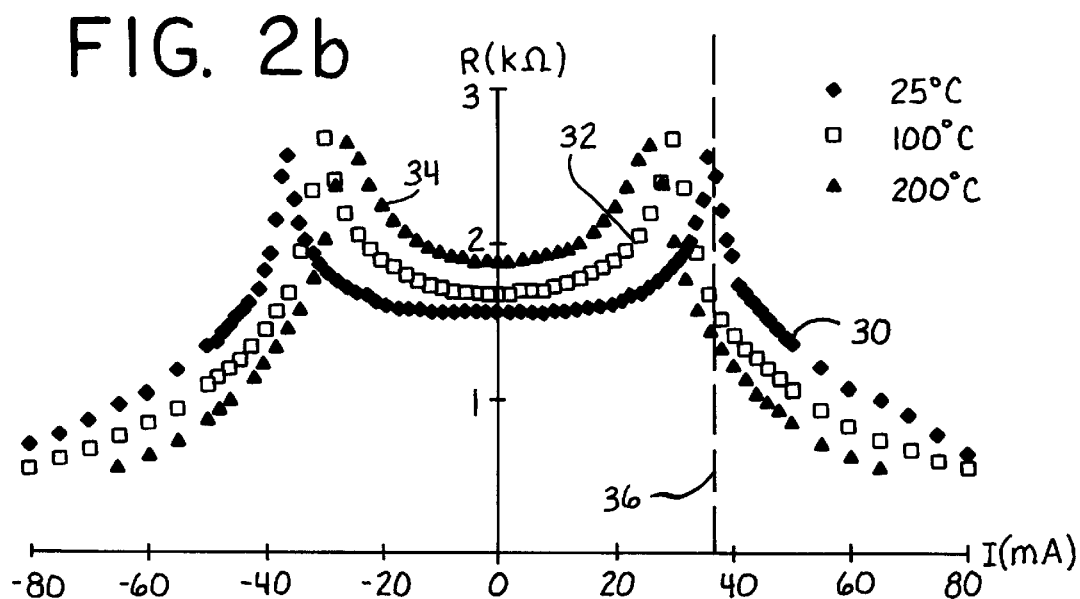
FIG. 2b is a graph of the resistivity of the channel of FIGS. 1a and b graphed as a function of current at three different temperatures.

The results of these measurements are depicted in FIGS. 2(a) and 2(b) which show the voltage drop across silicon channel 16, for example in the sample which had a 10 micron width and a 170 micron length. The resistance change is a function of the applied current as shown in FIG. 2(b) and in the voltage/current curve in FIG. 2(a) at the temperatures 25°, 100° and 200° C. For example, in FIG. 2(a) the experimental data shown by line 24 is the voltage/current curve at 25° C., line 26 is the voltage/current curve at 100° C., and line 28 is the voltage/current curve at 200°. Similarly, in FIG. 2(b) the resistivity is measured in kilo-ohms is shown at 25° C. by curve 30, at 100° C. by curve 32 and at 200° C. by curve 34. As best illustrated in the resistivity curve of FIG. 2(b), starting at zero current, at each temperature the resistance generally rises to a maximum which is defined as a critical current 36, for example, a current of approximately 38 mA in the case of the 25° C. test. At higher currents in either the positive or negative directions beyond the critical current, the resistance decreases gradually. The critical current is demonstrated in FIG. 2(b) as being weakly dependent upon temperature and decreasing with increasing temperature. Each of the samples discussed above showed substantially the same performance and are independent of the nature of the electrical contact employed. The temperature difference of the resistivity is thus conclusively demonstrated as being a characteristic of heavily doped p+—Si channel 16 only and no other structural element shown in FIGS. 1a and b.

Furthermore, the resistance is of the order of kilo ohms which rules out the contribution to the resistance from contacts 18, which typically have resistances in the range of 1–10 ohms. The specific contact resistivity of the metal to p+—Si contacts were measured and were found to be about $2 \sim 5 \cdot 10^{-6}$ ohms per $cm^2$ as measured by Kelvin bridge.

Figure 3:
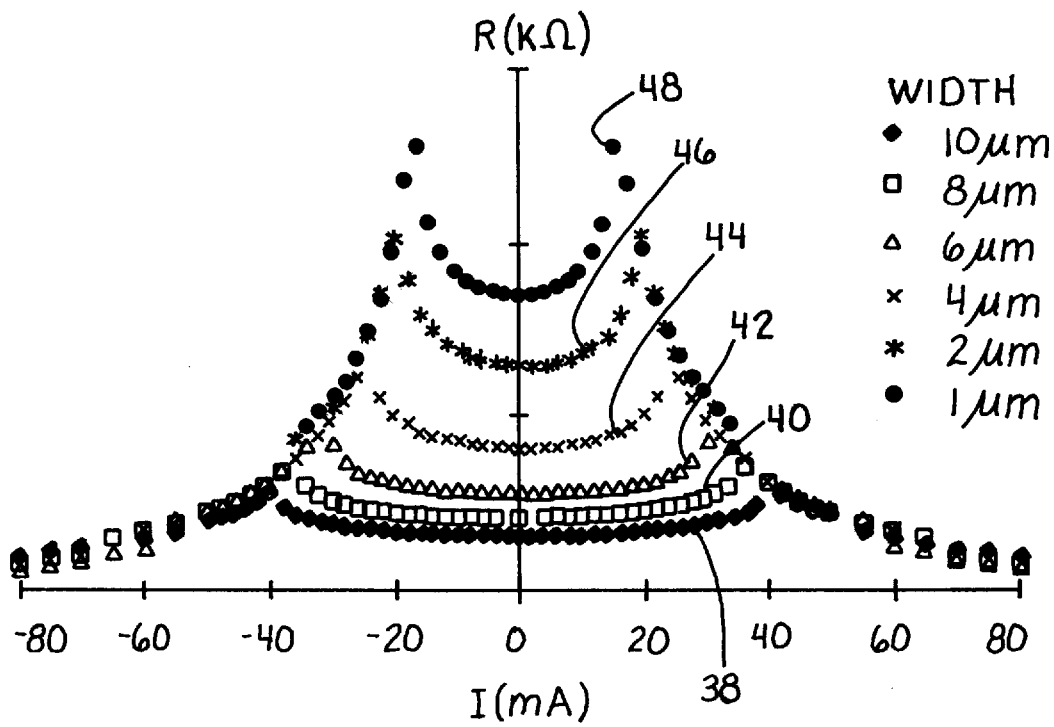
FIG. 3 is a graph of the resistivity of the channel of FIGS. 1a and b graphed as a function of current at three various different channel widths.

The resistance of channel 16 as a function of its width was also investigated as depicted in FIG. 3, which is a graph showing resistivity at room temperature as a function of current for channel width ranging from 10 microns to 8, 6, 4, 2 and 1 micron shown by curves 38, 40, 42, 44, 46 and 48 respectively. Several unique features are observable in the depiction of FIG. 3. The narrower the channel width, the higher the current density and the faster the rise in resistance. For example, the 1 micron wide channel had a lower critical current but a higher rise in resistivity from zero current up to the critical current as shown by curve 48, whereas the wider channel of 10 microns slowly increased out to a much higher critical current as shown on curve 38. While the 10 wide micron sample on curve 38 showed a wide ohmic regime, the 1 micron sample on curve 48 showed a negligible one. Second, the critical current, where the resistance achieves its maximum value, increased with the increasing width. Third, the magnitude of the resistance increased from an initial value to its maximum value decreased with increasing channel width. Fourth, the graduated decrease of resistance after achieving the critical current also decreased with increasing width.

Interestingly, the electrical behavior illustrated for channel 16 in FIG. 2(a) and 2(b) is reversible so long as the current through channel 16 was maintained below approximately 70 mA. Table 1 below lists the critical current densities for p+—Si channel 16 as a function of its channel width, w. The critical current density is defined by the relationship of $J_{crit.} = I_{crit}/wt$ where $I_{crit}$ is a critical current and t is the depth of p+—Si channel.

TABLE 1

| sample | 1 | 2 | 3 | 4 | 5 | 6 |
|---|---|---|---|---|---|---|
| length microns | 100 | 100 | 100 | 97.5 | 95 | 95 |
| width microns | 10 | 8 | 6 | 4 | 2 | 1 |
| Jcrit $10^6$ A/cm$^2$ | 2.4 | 2.8 | 3.1 | 3.2 | 4.4 | 6.0 |
| Qcrit eV | 0.55 | 0.62 | 0.55 | 0.34 | 0.28 | 0.28 |

Review of Table 1 shows that the critical current densities for channel 16 are in the range of 2~6×10$^6$ A/cm$^2$. These critical current densities were found to be a function of temperature as are the critical currents shown in FIGS. 2(b). Critical current densities decrease with increasing temperatures.

Figure 4:
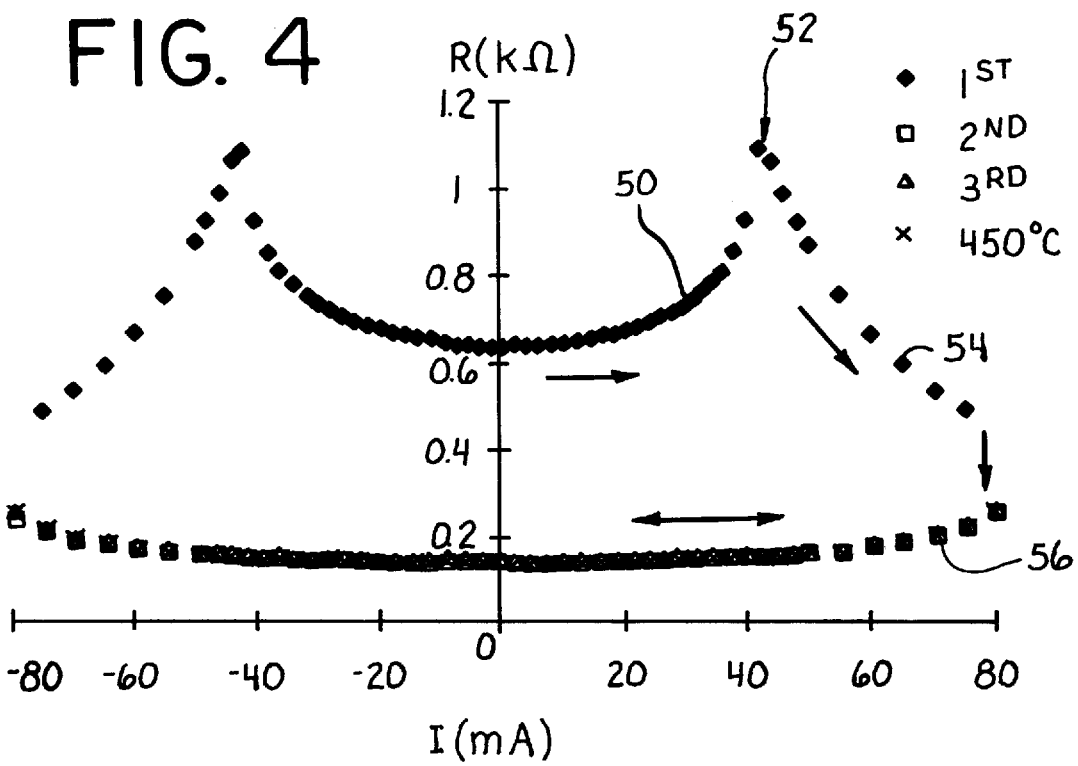
FIG. 4 is a graph of the resistivity of the channel of FIGS. 1a and b as a function of current showing the critical threshold and permanent dopant activation of the invention.

A dramatic and surprising event occurred when the applied current was increased to about 80 mA. FIG. 4 shows the resistivity of a p$^+$—Si channel 16 which was 10 microns wide and 100 microns long for four consecutive runs at room temperature as a function of applied current. The resistance curve of the first run followed curve 50 up to the critical current 52 as previously described in connection with FIG. 2(b)–3(b). After the critical current 52 was reached, the resistance of the channel 16 dropped precipitously as shown on curve 54 when the current reached about 80 mA which corresponds to a current density of about 5×10$^6$ amps per square centimeter. After reaching 80 mA the electrical behavior or resistivity of channel 16 then was described by curve 56. The resistivity was lowered below 0.2 kilo-ohms and was relatively flat form 0 to 80 mA and the electrical behavior represented by curves 50 and 54 could not be reestablished. The electrical performance characteristics of the supersaturated boron dope Si channel 16 had been permanently altered by reaching the burn-in or activation current density of 5×10$^6$ A/cm$^2$. The resistivity had permanently dropped by a factor of at least 5 in comparison with the post implantation and annealing values for the same device.

Figure 5:
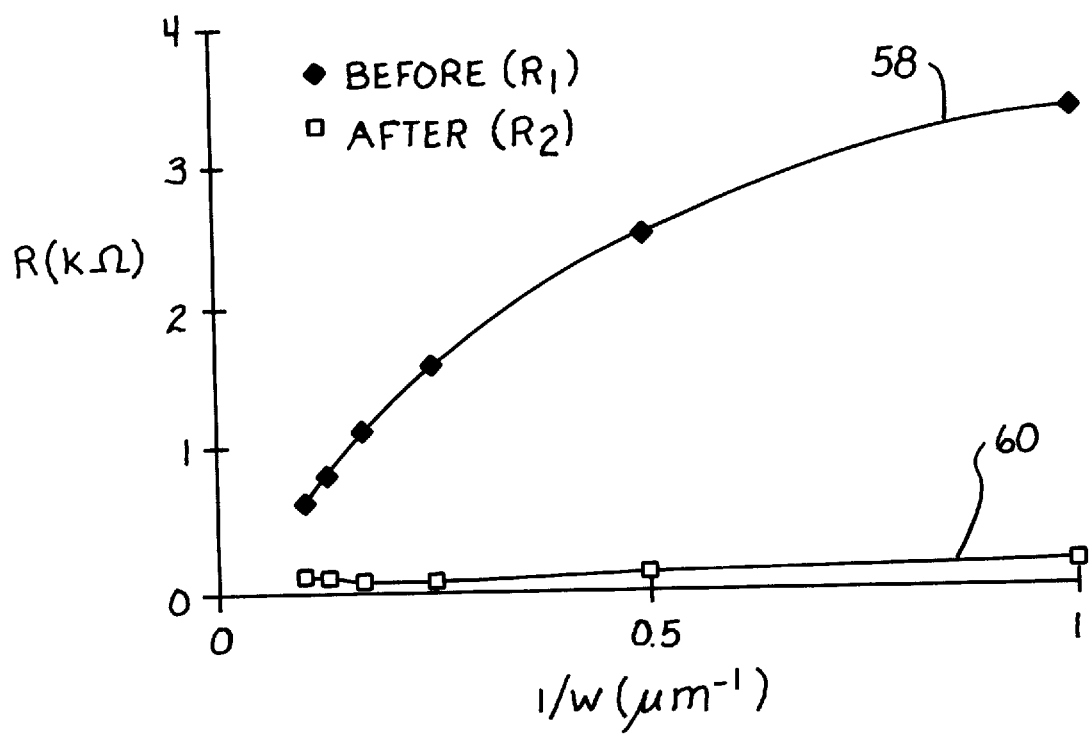
FIG. 5 is a graph of the resistivity of the channel of FIGS. 1a and b as a function of channel width graphed before and after dopant activation according to the invention.

FIG. 5 is a graph of the resistivity in the first state before activation represented by curves 50 and 54 and in the second state of curve 56 after activation for a series of samples ranging in width. Curve 58 represents the resistivity before the activation current was achieved and curve 60 after activation for the same devices. At each channel width the resistance decreased by a factor of between 5 to 18 as summarized in the corresponding Table 2 below. The stability of resistivities of the test samples were tested by annealing the sample at 450° C. for 30 minutes. As indicated in Table 2 there was little significant resistivity change caused by annealing which shows that the resistance change was a stable reconfiguration of the electrical properties of channel 16.

TABLE 2

| width microns | $R_1$ after annealing but before activation | $R_2$ after activation | $R_3$ after activation and annealing | $R_1/R_2$ | Jactiv $10^6$ A/cm$^2$ |
|---|---|---|---|---|---|
| 10 | 633 | 132 | 125 | 5 | 4.8 |
| 8 | 818 | 116 | 102 | 7 | 6.3 |
| 6 | 1140 | 108 | 117 | 11 | 8.1 |
| 4 | 1600 | 94 | 88 | 17 | 11.3 |
| 2 | 2537 | 143 | 128 | 18 | 15.6 |
| 1 | 3355 | 192 | 171 | 18 | 18.3 |

It has also been determined according to the invention that instead of slowly ramping up the current at about 0.5 mA per second as was the case in connection with the runs depicted in FIG. 4, the same large and permanent resistance drop could be obtained instantaneously by directly applying the activation current, which was defined as a current where abrupt resistant drop was permanently maintained. The activation current densities were found to increase with decreasing width and are summarized in Table 2 above, where it ranged from 4.8×10$^6$A/cm$^2$ for a 10 micron wide channel to 18.3×10$^6$A/cm$^2$ for the 1 micron wide channel.

The mechanism which causes the observed electrical characteristics of heavily boron doped silicon is not well understood. It is thought that the mobile interstitial silicon atoms produced during ion implantation damage may have strong influence on the formation of the excess boron. For a highly doped p$^+$—Si system, the dopant concentration may exceed the solubility limit set by the post-implantation annealing temperature. For example, in the illustrated embodiment a dose of 5×10$^{15}$ ions/cm$^2$ of BF$_2^+$ at 40 keV was implanted into the Si so that the average concentration was 3.3·10$^{20}$ ions per cubic centimeter of boron. At an annealing temperature of 900° C. the solubility of boron is about 5·10$^{19}$ ions/cm$^{-3}$, which was substantially smaller than the average concentration of implanted boron realized in the illustrated embodiment. Consequently, only a portion of the boron atoms were activated by the annealing step, leaving behind a large amount of excess boron to form in what is speculated to be SiB$_x$ clusters.

It is hypothesized that under the stress of a high current density, these SiB$_x$ clusters disassociate into interstitial boron atoms. The electrical scattering effect of the interstitial boron atoms raises its resistance. As the applied current increases, the number of interstitial boron atoms also increases. At the critical current, where the resistance is maximized, and the solid solubility limit of interstitial boron has been reached. At current densities beyond this solubility limit, each interstitial boron atom then starts to couple with a Si lattice atom to form a dumb-bell pair and the resistance begins to decrease. This is the event which we believe marks the onset of the dopant activation inducted by high current density.

As the current further increases more and more of the B-Si dumb-bell pairs are formed. As a result, the resistance to the p$^+$—Si channel 16 decreases gradually to a value well below the original value. If the applied current is reduced, the mechanism is reversed and the dumb-bells will disassociate and the SiB$_x$ clusters reform returning the resistance to its earlier value.

An extremely high current, which we have defined here as the activation current, which was shown in the illustrated embodiment at about 80 mA in the case of a 10 micron wide channel 16, the resistance of the p$^+$—Si drops abruptly. This abrupt drop implies that there is a nearly complete activation of the boron dopants. Furthermore, the resistance reduction is irreversible. The resistance curve of the activated p$^+$—Si is stable as shown by curve 56 in FIG. 4. It is hypothesized that at the precipitous drop of resistance, the boron atom in the dumb-bell pair displaces its Si partner into a interstitial site and becomes a substitutional boron atom. The substitutional boron dopants are stable, even beyond the solubility limit at 400° C. for 30 minutes. Since activation can be achieved instantaneously by directing applying the activation current, there is no long range diffusion of boron or Si atoms taking place in the mechanism.

In FIG. 2($b$) it was demonstrated that the resistance below the critical current increases with the temperature. This is also true for the resistance of the activated p$^+$—Si shown by curve 56 in FIG. 4. This metallic behavior may be due to scattering from clusters or interstitial boron which are responsible for reduced carrier mobility.

Also note that the resistance, $R_1$, in Table 2 is not proportional to the reciprocal of the cross-sectional area of the channel, especially for the narrower 1 and 2 micron wide channels. This size effect can be seen from the decrease in the activation energy with decreasing channel width shown in Table 1 as well as the greater resistance drop with the narrower channels as plotted in FIG. 5. For all the size effects, it is plausible that in the pattern formation of channel 16 and the lateral spread from the mask edge in ion implantation may have an influence on the electrical performance of the narrower channels and hence a two dimensional model is needed to better explain the implantation and dopant activation for smaller structures. Beyond this possibility, the size effects seen in the data of Tables 1 and 2 are not well understood. Nevertheless, it is clear that the method of dopant activation by high current densities according to the invention is more efficient the smaller the size of the structure of channel 16.

Therefore, while the electrical mechanism is not well understood, it is clear that activation of boron dopants and p$^+$—Si by high current densities is achievable. This method of activation may activate dopants beyond their solubility limits as imposed by conventional thermal annealing. It appears that the activation of current density must be above about $5 \cdot 10^6$ A/cm$^2$ or above for implanted boron. Resistance reductions of the factor of 5 to 18 over the best attainable by thermal annealing for boron implanted Si is thus achievable therefore allowing for the manufacture of much smaller active semiconductor channels and structures.

The illustrated embodiment has been described in the context of p dopants, but it must be understood that a similar mechanism and behavior is expected in n doped semiconductor material as well. While (100) Si crystal has been employed to demonstrate the operation of the invention, other crystal orientations and other semiconductor systems other than Si are also within the express contemplated scope of the invention. The method of the invention has direct application to and benefit to any type of semiconductor processing regardless of the fabrication or technology type, i.e. CMOS, NMOS, MOS etc., and in any kind of structure, i.e. bipolar transistors, field effect transistors, etc. regardless of whether shallow or thick channels or junctions are used. Further, the dopant may be disposed into the semiconductor in any manner desired and not simply by ion implantation.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims.

For example, the illustrated embodiment has been described in the context of forming a defined junction or channel in crystalline silicon, but the dopant activation of the invention can be employed in any semiconductor system where reduced resistivity can be used, such as in semiconductor lasers and other photonic devices.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A nonthermal method of activating a dopant in semiconductor material comprising:

supersaturating said semiconductor material with a dopant; and applying a current with a minimum current density to said supersaturated semiconductor material above an activation threshold at an arbitrary temperature, said current being termed a high density current when above said activation threshold;

whereby said supersaturated dopants in said semiconductor material is activated.

2. The method of claim 1 where supersaturating said semiconductor material with said dopant comprises ion implanting said dopant above a solid solubility concentration within said semiconductor material.

3. The method of claim 1 further comprising partially activating said dopant in said super saturated semiconductor material prior to applying said high density current.

4. The method of claim 2 further comprising partially activating said dopant in said supersaturated semiconductor material prior to applying said high density current.

5. The method of claim 3 where partially activating said dopant comprises annealing said supersaturated semiconductor material to obtain thermal activation of said dopant.

6. The method of claim 4 where partially activating said dopant comprises annealing said supersaturated said semiconductor material to obtain thermal activation of said dopant.

7. The method of claim 1 where applying said high density current above an activation threshold applies a current of approximately $5 \times 10^6$ A/cm$^2$.

8. The method of claim 1 where applying said high density current applies a current of at least $5 \cdot 10^6$ A/cm$^2$.

9. The method of claim 1 where applying said high density current applies said current at room temperature.

10. The method of claim 1 where supersaturating said semiconductor with a dopant comprises selectively defining a supersaturated doped channel within said semiconductor material.

11. The method of claim 1 wherein super saturating said semiconductor material with dopant supersaturates said semiconductor material with a p type dopant.

12. The method of claim 1 where super saturating said semiconductor material with dopant supersaturates said semiconductor material with n type dopant.

13. The method of claim 10 wherein said selectively defined channel is a shallow channel of less than 1 micron depth.

14. The method of claim 1 wherein supersaturating said semiconductor material with dopant comprises super saturating crystalline silicon with dopant.

15. A nonthermal method for activating a dopant in silicon comprising:

ion implanting said dopant into said silicon to supersaturate said silicon with said dopant;

annealing said doped silicon; and applying a current at an arbitrary temperature with a minimum current density above an activation threshold through said annealed doped silicon to irreversibly activate said supersaturated dopant in said silicon, said current being termed a high density current when above said activation threshold.

16. The method of claim 15 wherein ion implanting a dopant in said silicon implants boron in excess of $10^{15}$ ion/cm$^2$.

17. The method of claim 15 where applying a high density current to said annealed doped silicon applies a current in excess of $5 \times 10^6$ A/cm$^2$ through said annealed doped silicon.

18. The method of claim 15 where annealing said doped silicon anneals said silicon at 900° C. for at least 30 minutes.

19. The method of claim 15 where applying said high density current applies said current at room temperature.

* * * * *